United States Patent
Campbell

(10) Patent No.: US 12,055,578 B2
(45) Date of Patent: Aug. 6, 2024

(54) SECURING A PROBE TO A DEVICE UNDER TEST

(71) Applicant: Tektronix, Inc., Beaverton, OR (US)

(72) Inventor: Julie A. Campbell, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 490 days.

(21) Appl. No.: 17/339,877

(22) Filed: Jun. 4, 2021

(65) Prior Publication Data
US 2022/0011361 A1  Jan. 13, 2022

Related U.S. Application Data

(60) Provisional application No. 63/049,548, filed on Jul. 8, 2020.

(51) Int. Cl.
*G01R 31/28* (2006.01)
*G01R 1/067* (2006.01)

(52) U.S. Cl.
CPC ..... *G01R 31/2808* (2013.01); *G01R 1/06738* (2013.01); *G01R 1/06755* (2013.01)

(58) Field of Classification Search
CPC .... G01R 1/06705; G01R 1/18; G01R 31/001; G01R 31/2801
See application file for complete search history.

(56) References Cited

U.S. PATENT DOCUMENTS

| 4,209,742 A | * | 6/1980 | Bender | G01R 1/06788 439/345 |
| 7,049,843 B2 | * | 5/2006 | Yakymyshyn | G01R 1/071 324/754.23 |
| 2005/0266733 A1 | * | 12/2005 | Martin | G01R 1/06788 439/695 |

\* cited by examiner

*Primary Examiner* — Tung X Nguyen
(74) *Attorney, Agent, or Firm* — Miller Nash LLP; Andrew J. Harrington

(57) ABSTRACT

A method of securing a probe tip to a device under test (DUT), the method comprising: positioning the probe tip near a test point of the DUT, the probe tip comprising a connection point on a signal-path portion of the probe tip and an attachment tab, the connection point making an electrical connection with the test point of the DUT, the attachment tab extending away from the signal-path portion of the probe tip; applying an adhesive to the DUT through a hole in the attachment tab of the probe tip; and curing the adhesive to secure the probe tip to the DUT.

25 Claims, 5 Drawing Sheets

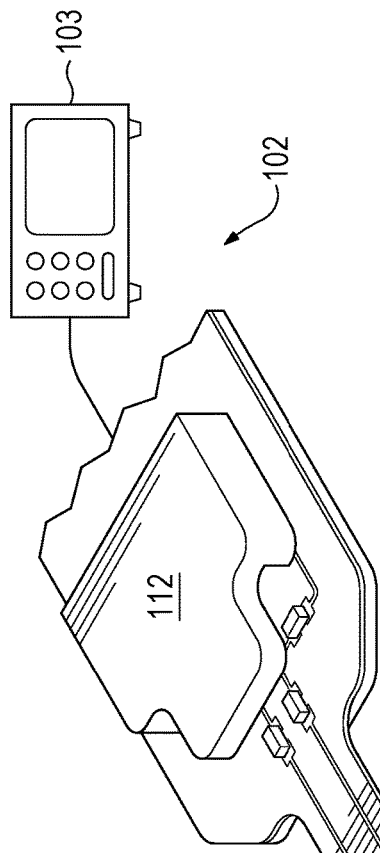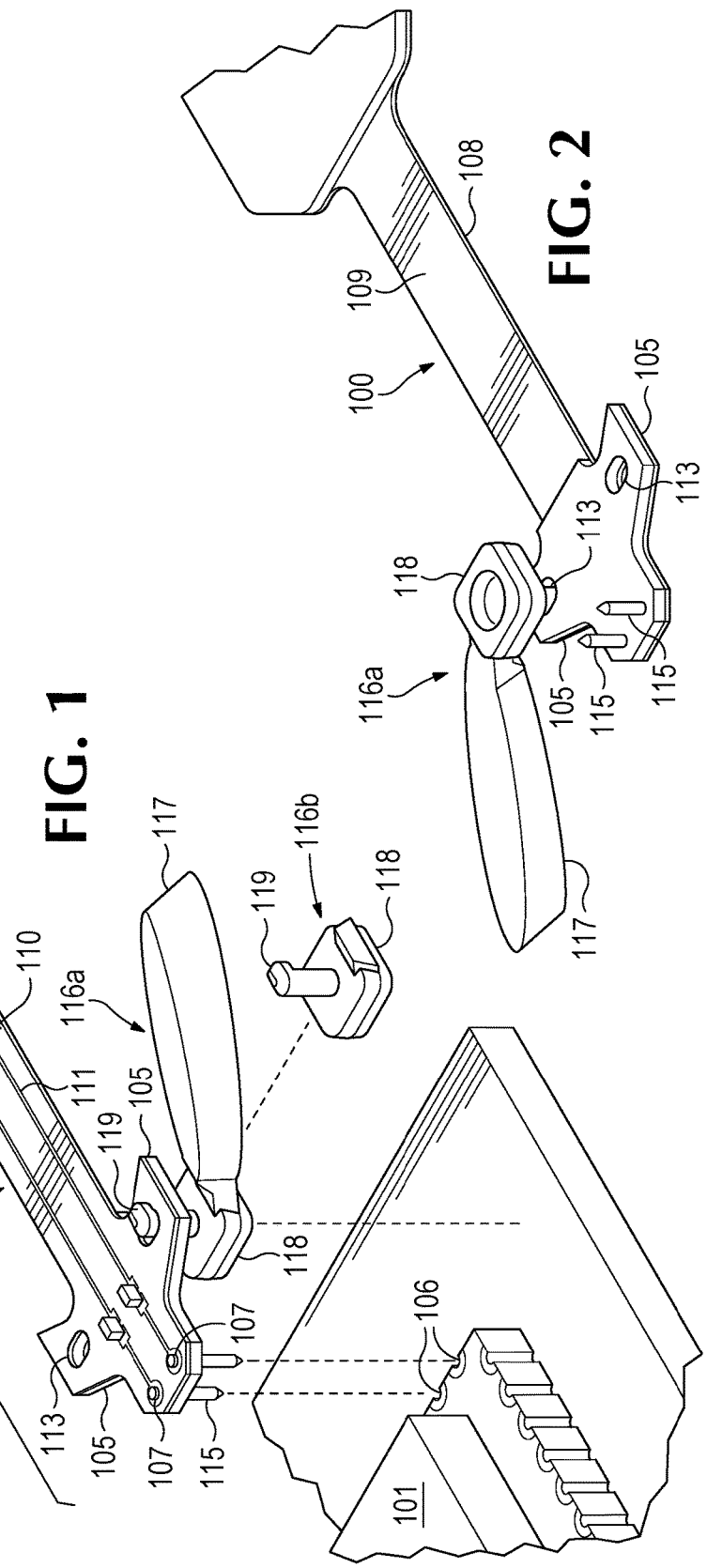

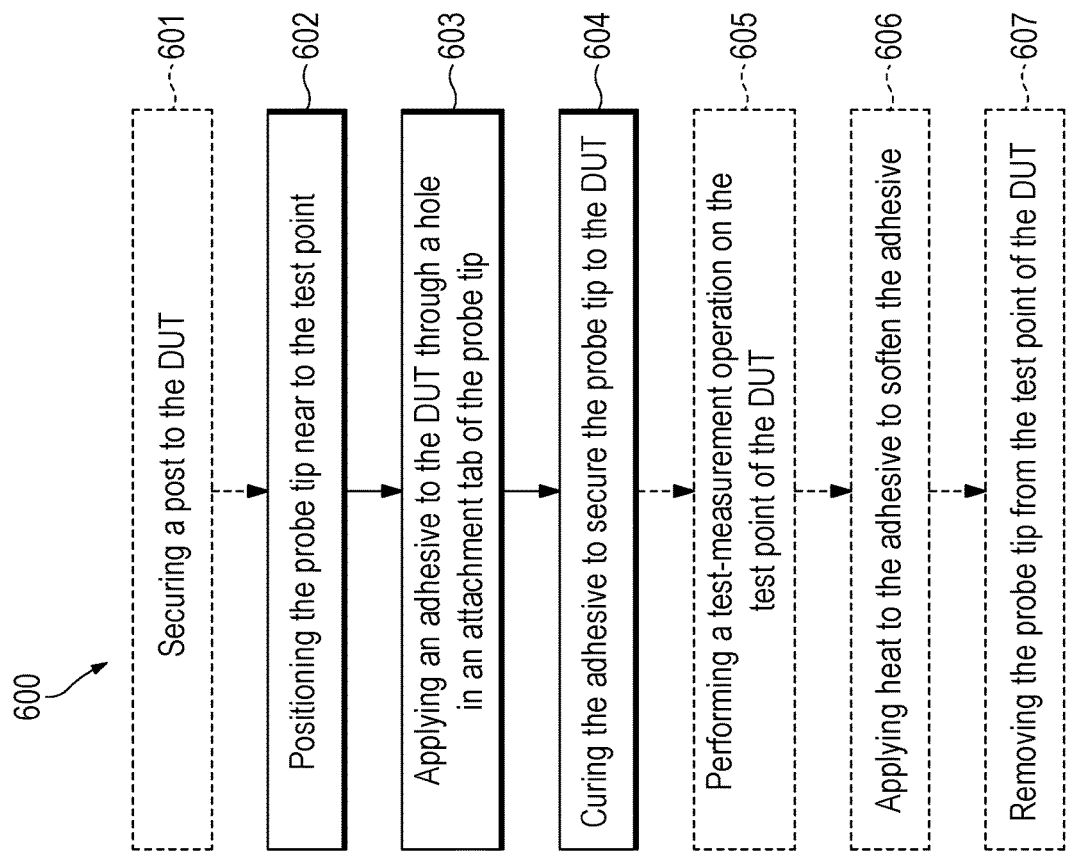
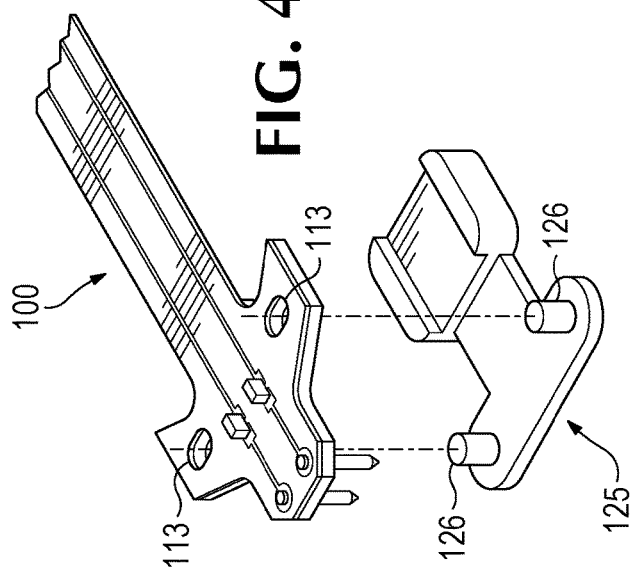
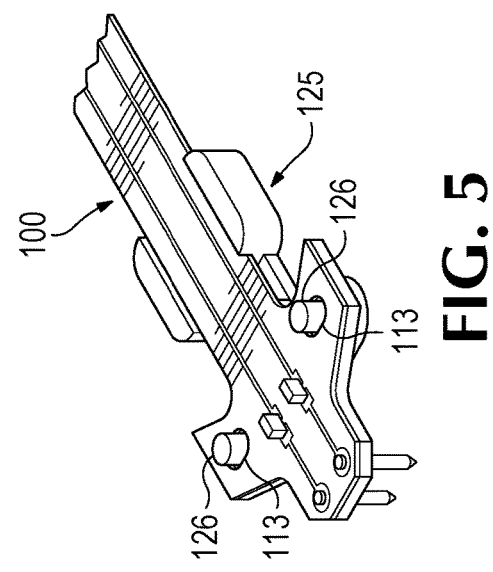

SECURING A PROBE TO A DEVICE UNDER TEST

CROSS-REFERENCES TO RELATED APPLICATIONS

This patent application claims the benefit of provisional Application No. 63/049,548 filed Jul. 8, 2020, which is incorporated into the present disclosure by this reference.

TECHNICAL FIELD

This disclosure relates to test and measurement systems that include a test and measurement probe coupled to a device under test, and more particularly to techniques for securing the probe to the device under test.

BACKGROUND

Users of test and measurement instruments, such as oscilloscopes, in a test and measurement system, often use probes to connect a device-under-test (DUT), such as a circuit board, to an input of a test and measurement instrument in order to visualize and perform measurements of electrical signals occurring in the DUT. These users are typically engineers designing circuit boards for a wide variety of electronic devices. Consumers of electronic devices generally desire these devices to be as physically small as possible. Accordingly, engineers are often tasked with packing a high quantity of electrical components into a small circuit board area. Additionally, the electrical components themselves are generally designed to be physically smaller with each successive generation. The small size and high density of electrical components in a DUT can make it challenging for engineers to probe test points on a DUT.

Therefore, test and measurement probes must be able to make electrical contact with DUT test points that can be difficult to access, while still providing high bandwidth and good signal fidelity. Test points in a DUT vary considerably in geometry and accessibility. They may reside in a DUT in every angle of orientation from horizontal to vertical. They may be obscured by electrical components. Contemporary high-speed signal busses, such as DDR2, DDR4 and PCIe Gen 4, among others, often use differential signaling, requiring that a probe used to measure these signals must be able to make simultaneous electrical contact with two test points. This may be even more challenging if the two test points are on different planes.

Sometimes a probe may be semi-permanently attached to DUT test points. For example, a "solder-down" type probe may have wires from the probe that are soldered to test points, or that are attached to test points with conductive epoxy.

This kind of semi-permanent probe attachment scheme can provide a reliable electrical connection to the DUT. However, solder-down probes also have a number of disadvantages. Due to the often poor accessibility of the DUT test points, the process of soldering probe wires to the DUT can be challenging for a probe user, requiring long set-up times and exceptional dexterity. Further, inconsistencies in the quality of the solder connection can cause high variability in signal fidelity, especially at upper frequencies. Additionally, the small gauge of wire used to attach the probe makes it easy for a user to potentially damage the DUT when soldering the wires in place. Furthermore, the wires, solder connection, and/or the probe tip can be damaged if the DUT and/or probe are inadvertently moved.

U.S. patent application Ser. No. 15/978,090, filed May 11, 2018, titled "Component Attachment Technique Using a UV-Cure Conductive Adhesive," hereinafter referred to as "Campbell," the contents of which are hereby incorporated by reference in their entirety into the present application, discloses employing a ultraviolet light (UV)-curable conductive adhesive as an alternative to solder, in particular for conductively coupling a probe to a test point on a DUT. As disclosed in Campbell, the UV-curable adhesive provides several advantages over conventional solder in this context. In particular, the disclosed UV-curable conductive adhesive may bond more readily with surfaces adjacent to the test point, thereby enhancing the mechanical strength of the probe-to-DUT connection, while still providing the required conductive connection.

Nevertheless, although the UV-curable conductive adhesive may provide a stronger mechanical connection to the DUT than conventional solder, any of the DUT, UV-curable conductive adhesive, wires, and/or the probe tip may still be damaged if the DUT or test system are inadvertently moved, bumped, etc. The potential for such damage is increased when a user must make multiple probe connections in a small physical area of the DUT, such as is often required when testing a DUT employing many modern technologies, for example, Double Data Rate Gen 5 (DDR5) memory.

Therefore, regardless of whether a user employs conventional solder or a UV-curable conductive adhesive to make an electrical connection between a DUT and test probe, there is a need to provide enhanced mechanical strength for this connection in order to prevent damage to the DUT, the probe, or both.

Conventional solutions for providing more robust mechanical support for a probe connection include the following.

Using super glue (i.e. cyanoacrylate) to affix a non-conductive part of the probe tip to a non-conductive part of the DUT. However, super glue gets everywhere; it is runny and cures uncontrollably. It gums up their DUT and is extremely difficult to remove the tip. It damages the tip and the DUT.

Using hot melt ("hot glue") to affix a non-conductive part of the probe tip to a non-conductive part of the DUT. The user secures the tip with hot melt after UV Cure tip attach or soldering the electrical connections. However, hot met is difficult to apply in small amounts so it can get on the sensitive tip measurement circuitry and alter the test data. It doesn't always bond well to the DUT. When it does bond well with the DUT it is very difficult to remove leaving clumps of residue or damaging the tip.

Using a double-sided tape between the DUT and the back of the tip. However, the tapes comprised of foam wiggle free easily and don't bond well due to the foam core.

Configurations of the disclosed technology address shortcomings in the prior art.

BRIEF DESCRIPTION OF THE DRAWINGS

FIG. 1 is an exploded, top, perspective view of a probe tip in relation to a DUT, according to example configurations.

FIG. 2 is a bottom, perspective view of a portion of the probe tip of FIG. 1.

FIG. 4 is an exploded, top, perspective view of a probe tip, according to an example configuration having an optional clip.

FIG. 5 is a top, perspective view of the probe tip of FIG. 4 coupled to the optional clip.

FIG. 6 illustrates a first example method of securing a probe tip to a device under test.

DETAILED DESCRIPTION

Figure 3:
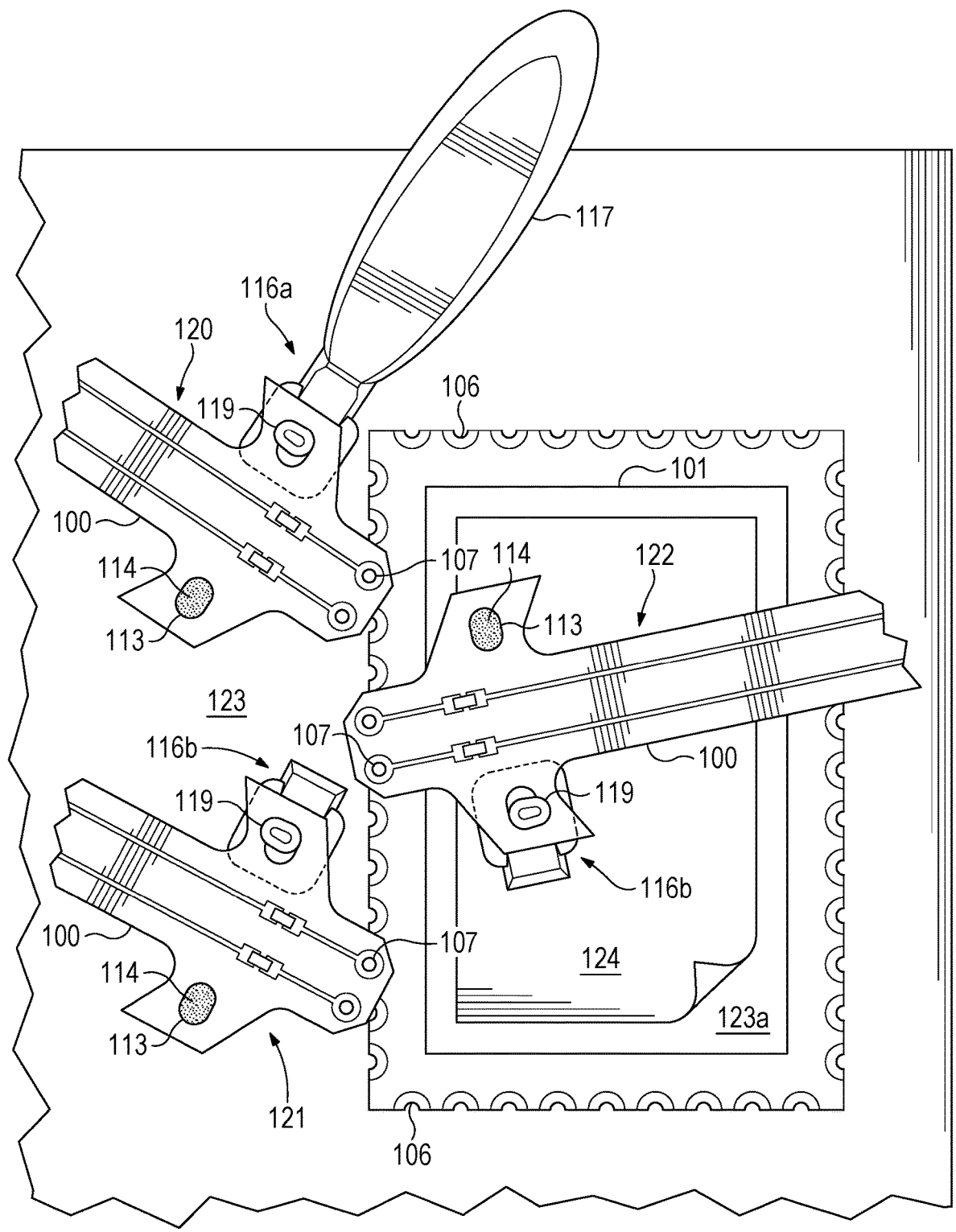
FIG. 3 is a top view of several probe tips, according to example configurations, positioned in relation to a DUT.

As described herein, aspects are directed to methods for securing a probe tip to a DUT. According to some example configurations of the disclosed technology, a non-conductive, UV-curable adhesive may be employed to secure a probe tip to a DUT near a test point on the DUT. In contrast to conventional methods, such a UV-curable adhesive is much easier to apply in controlled quantities than either super glue or hot melt. The UV-curable adhesive may have a higher viscosity than super glue, so as not to run all over the DUT. It takes very little of such a UV-curable adhesive to hold the probe tip very securely in place. It provides much better adhesion strength than double-sided tape. Furthermore, the bond created by the UV-curable adhesive may be broken by application of low heat to easily and cleanly remove the test probe from the DUT, thereby allowing easy repositioning of a test probe tip.

FIG. 1 is an exploded, top, perspective view showing portions of a probe tip 100 in relation to a device under test (DUT) 101, according to example configurations. FIG. 2 is a bottom, perspective view of a portion of the probe tip 100 of FIG. 1. As illustrated in FIGS. 1 and 2, a probe tip 100 for a test-and-measurement probe 102 may include a signal-path portion 104, an attachment tab 105, and a connection point 107. The DUT 101 may be, for example, a circuit board or chip, such as a double-data-rate (DDR) chip, and may include at least one test point 106. The test point 106 may be or include an interposer connected to the circuit board or chip. The test-and-measurement probe 102 may be coupled to a test-and-measurement instrument 103, such as an oscilloscope.

The signal-path portion 104 of the probe tip 100 has a first side 108, a second side 109, and an electrical circuit 110. The electrical circuit 110 may be integrated into any combination of portions of the first side 108, portions of the second side 109, or portions of one or more interior layers (not shown) of the probe tip 100. For example, the circuit 110 integrated into the first side 108 may include traces 111 providing a signal path from the connection points 107 to other active circuitry 112 on the probe tip 100, such as a signal-conditioning integrated circuit. The second side 109 of the probe tip 100 is opposite the first side 108 of the probe tip 100. As illustrated in FIGS. 1 and 2, the signal-path portion 104 of the probe tip 100 is the structure indicated generally by the reference number 104 but excluding the attachment tabs 105.

The attachment tab 105 extends away from the signal-path portion 104 of the probe tip 100 to allow the traces 111 of the circuit 110 integrated into the first side 108 to extend from the connection point 107 and along the signal-path portion 104 of the probe tip 100. The electrical behavior of the circuit 110 integrated into the first side 108 and of the other active circuitry 112 on the probe tip 100 may be adversely impacted if any adhesive 114 (see FIG. 3) is accidentally applied to the circuitry. Thus, locating the attachment tabs 105 distant from the connection points 107 and the traces 111 reduces the risk of adhesive 114 being applied to the connection points 107, the circuit 110 integrated into the first side 108, or the other active circuitry 112 on the probe tip 100.

The attachment tab 105 may be configured to be secured to the DUT 101 at a location on the DUT 101 other than at the target test point 106. Examples of such configurations are discussed more fully below with respect to FIG. 3.

The attachment tab 105 may have a hole 113 configured to receive an adhesive 114. For example, a user may apply an adhesive 114 to the DUT 101 through the hole 113 in the attachment tab 105 of the probe tip 100, and the adhesive 114 may be then cured to secure the probe tip 100 to the DUT 101. The adhesive 114 may be, for example, a non-conductive, UV-curable adhesive, where a UV-curable adhesive is an adhesive formulation that is intended to be cured by exposing the formulation to ultraviolet (UV) light. While generally illustrated as a round hole or a slot, other shapes would also be appropriate for the hole 113.

In versions, the probe tip 100 is removably coupled to the DUT 101 through the attachment tab 105. In this context, "removably coupled" means that the probe tip 100 can be separated and moved away from the DUT 101 without causing permanent damage to either component. For example, when desired, heat may be applied to soften the adhesive 114, allowing the probe tip 100 to be removed from the DUT 101.

As illustrated in FIGS. 1 and 2, the connection point 107 may be on the signal-path portion 104 of the probe tip 100. The connection point 107 may be configured to contact and electrically connect the desired test point 106 of the DUT 101 to the circuit 110 integrated on the signal-path portion 104 of the probe tip 100 (and, in configurations, ultimately to the other active circuitry 112 on the probe tip 100). The connection point 107 of the probe tip 100 may further include a pin or wire 115. The pin 115 may be configured to couple the connection point 107 to the test point 106 of the DUT 101. For example, the pin 115 at the connection point 107 may be inserted into, or placed in direct contact with, the test point 106 of the DUT 101. In some configurations, the pin 115 may be spring-loaded. As noted above, the test point 106 may be or include an interposer connected to the circuit board or chip. In configurations, the pin 115 may be a wire soldered to the connection point 107 and to the test point 106 to couple the connection point 107 to the test point 106 of the DUT 101. In configurations, the wire 115 may be electrically coupled between the connection point 107 and the test point 106 using a conductive adhesive, rather than solder. Preferably, the length of the wire 115 is kept as short as possible to minimize effects of the electrical stub length of the wire 115 on the signal of interest at the test point 106.

Some example configurations may also include a foot 116, such as the handled foot 116a illustrated in FIGS. 1 and 2, which includes an extended handle 117, or the foot 116b without the extended handle illustrated in FIG. 1. The handled foot 116a is illustrated in FIGS. 1 and 2 as being coupled to the attachment tab 105 of the probe tip 100, while the foot 116b without the extended handle is illustrated in FIG. 1 as being an alternative to the handled foot 116a. The foot 116 may be configured to couple to the DUT 101 at a location on the DUT 101 other than at the target test point 106 of the DUT 101. For example, the foot 116 may include a base portion 118, allowing the foot 116 to be coupled to the DUT 101. The coupling may be, for example, affixing the foot 116 to the DUT 101 with adhesive 114, such as UV-curable adhesive. In versions, the foot 116 is removably coupled to the DUT 101. In this context, "removably coupled" means that the foot 116 can be separated and moved away from the DUT 101 without causing permanent damage to either component. For example, when desired, heat may be applied to soften the adhesive, allowing the foot 116 to be removed from the DUT 101. In example configurations that include the handled foot 116a, the extended handle 117 of the handled foot 116a may facilitate removal of the handled foot 116a from the DUT 101.

The foot 116 may be configured to couple to the attachment tab 105 of the probe tip 100. For example, the foot 116 may include a post 119 that may be inserted into the hole 113 in the attachment tab 105 of the probe tip 100. In versions, inserting the post 119 through the hole 113 in the attachment tab 105 of the probe tip wo includes snapping the post 119 into the hole 113 in the attachment tab 105 through an interference fit between the post 119 and the hole 113 in the attachment tab 105. For example, the hole 113 in the attachment tab 105 may snap over a grooved catch on the post 119 of the foot 116, similar to a button and a buttonhole. In versions, inserting the post 119 through the hole 113 in the attachment tab 105 of the probe tip wo may include engaging a key-lock feature to mechanically secure the attachment tab 105 to the post 119.

FIG. 3 is a top view of several probe tips 100, according to example configurations, positioned in relation to an example DUT 101. As illustrated in FIG. 3, several probe tips 10o may be installed in a comparatively small area to access different test point 106 of the DUT 101 and to perform test—measurement operations. The term "test—measurement operation" as used in this disclosure means to acquire an electrical signal from the DUT 101 or to inject an electrical signal into the DUT 101.

A first example configuration 120 in FIG. 3 illustrates the connection point 107 of the probe tip 100 contacting and making an electrical connection with a test point 106 of the DUT 101, the probe tip 10o being coupled to the DUT 101 through a handled foot 116a. A second example configuration 121 and a third example configuration 122 each illustrate the connection point 107 of the probe tip 100 contacting and making an electrical connection with test points 106 of the DUT 101, the probe tip 100 being coupled to the DUT 101 through a foot 116b without the extended handle. While illustrated showing the foot 116b without the extended handle, either of the second and third example configurations 121, 122 could instead include the handled foot 116a. In each case, the foot 116 may be coupled to the DUT 101 at a location on the DUT 101 other than at the target test point 106 of the DUT 101. As illustrated, the foot 116 is coupled to a surface 123 near the test point 106 of the DUT 101 where the probe tip wo is connected. As illustrated for the third example configuration 122, the surface 123 near the test point 106 may be a surface 123a on a circuit board or chip.

In each of the first example configuration 120, the second example configuration 121, and the third example configuration 122, instead of, or in addition to, the probe tip 100 being coupled to the DUT 101 through a foot 116, the probe tip 100 may be coupled to the DUT 101 by applying an adhesive 114 to the DUT 101 through or around the hole 113 in the attachment tab 105 of the probe tip 100. The adhesive 114 may be coupled to the DUT 101 by applying an adhesive 114 to the DUT 101 through or around the hole 113 in the attachment tab 105 of the probe tip 100. The adhesive 114 may be then cured to secure the probe tip 100 to the DUT 101. In each of the configurations discussed, a length of adhesive tape 124 may also cover the attachment tab 105 of the probe tip 100 or the foot 116, providing additional stability.

As illustrated in FIG. 3, configurations may include a length of adhesive tape 124 affixed to the DUT 101 at a location on the DUT 101 other than at the target test point 106 of the DUT 101. The adhesive tape 124 could be, for example, high-tack, peel-removable adhesive tape that does not include any foam padding. In such configurations, the attachment tab 105 of the probe tip 100 or the foot 116 may be coupled to the length of adhesive tape 124, the length of adhesive tape 124 being between the DUT 101 and the attachment tab 105 or the foot 116. Such configurations may have the advantage of allowing the attachment tab 105 or the foot 116 to be more easily removed from the DUT 101 when desired. For example, the length of adhesive tape 124 may be peeled off of the DUT 101 and, once removed, the attachment tab 105 or the foot 116 may be removed from the length of adhesive tape 124 by, for example, applying heat to soften the adhesive 114.

FIG. 4 is an exploded, top, perspective view of a probe tip 100, according to an example configuration having a clip 125 couplable to the probe tip 100. FIG. 5 is a top, perspective view of the probe tip 100 of FIG. 4 coupled to the clip 125. In configurations the clip 125 may be between the probe tip 100 and the DUT 101 when the probe tip 100 is secured to the DUT 101. In configurations that include a length of adhesive tape 124, the clip 125 may be between the probe tip 100 and the length of adhesive tape 124 when the probe tip 10o is secured to the DUT 101 through the length of adhesive tape 124.

In configurations, the clip 125 may be removably coupled to the probe tip 100. In this context, "removably coupled" means that the clip 125 can be separated and moved away from the probe tip 100 without causing permanent damage to either component. For example, the clip 125 may include clip pins 126 configured to engage the holes 113 in the attachment tabs 105. In addition or instead of the clip pins 126, the clip 125 may be affixed to the probe tip 100 with adhesive 114, such as UV-curable adhesive. When desired, heat may be applied to soften the adhesive 114, allowing the clip 125 to be removed from the probe tip 100. In configurations, the clip 125 is substantially translucent, and curing the non-conductive, UV-curable adhesive includes applying UV light through the clip 125. As used in this disclosure, "substantially translucent" means largely or essentially allowing light to pass through. In configurations, the clip 125 is removably coupled to the probe tip 100 without the use of adhesives to facilitate decoupling of the clip 125 from the probe tip 100. In configurations, the clip 125 may be removably coupled to the probe tip 10o by way of a snap fit between the clip 125 and the probe tip 100.

The clip 125 may be particularly beneficial in configurations where the probe tip 100 is being coupled to the DUT 101 other than through a foot 116. In such configurations, instead of coupling the probe tip 10o directly to the DUT 101 with adhesive 114, the probe tip 100 may be coupled to the clip 125 as discussed above, either with or without adhesive 114 between the probe tip 100 and the clip 125, and the clip 125 can be coupled to the DUT 101 with adhesive.

FIG. 6 illustrates a first example method of securing a probe tip 100 to a device under test. As illustrated in FIG. 6, a method 600 of securing a probe tip 100 to a device under test (DUT 101) may include: positioning 602 the probe tip 100 near a test point 106 of the DUT 101, the probe tip 100 comprising a connection point 107 on a signal-path portion 104 of the probe tip 100 and an attachment tab 105, the connection point 107 making an electrical connection with the test point 106 of the DUT 101, the attachment tab 105 extending away from the signal-path portion 104 of the probe tip 100; applying 603 an adhesive 114 to the DUT 101 through a hole 113 in the attachment tab 105 of the probe tip 100; and curing 604 the adhesive 114 to secure the probe tip 100 to the DUT 101.

In some configurations, applying 603 the adhesive 114 to the attachment tab 105 may include applying a non-conductive, UV-curable adhesive to the attachment tab 105 of the probe tip 100.

In some configurations, positioning 602 the probe tip 100 may further include coupling a pin or wire 115 between the connection point 107 of the probe tip 100 and the test point 106.

In some configurations, method 600 may further include securing 601 a post 119 to the DUT 101 at the location on the DUT 101 other than at the target test point 106. In such configurations, positioning 602 the probe tip 100 near the test point 106 of the DUT 101 may further include inserting the post 119 through the hole 113 in the attachment tab 105 of the probe tip 100. In configurations, inserting the post 119 through the hole 113 may include snapping the post 119 into the hole 113 in the attachment tab 105 through an interference fit between the post 119 and the hole 113 in the attachment tab 105. In configurations, inserting the post 119 through the hole 113 may include engaging a key-lock feature to mechanically secure the attachment tab 105 to the post 119. In configurations, securing 601 the post 119 to the DUT 101 comprises removably coupling the post 119 to the DUT 101. In configurations, the post 119 is substantially translucent, and securing 601 the post 119 to the DUT 101 comprises applying a non-conductive, UV-curable adhesive to the post and curing the adhesive to secure the post 119 to the DUT 101 by applying UV light through the post 119.

In some configurations, method 601 may further include: performing 605 a test—measurement operation on the test point 106 of the DUT 101; applying 606 heat to the adhesive 114 to soften the adhesive 114; and removing 607 the probe tip 100 from the test point 106 of the DUT 101.

Figure 7:
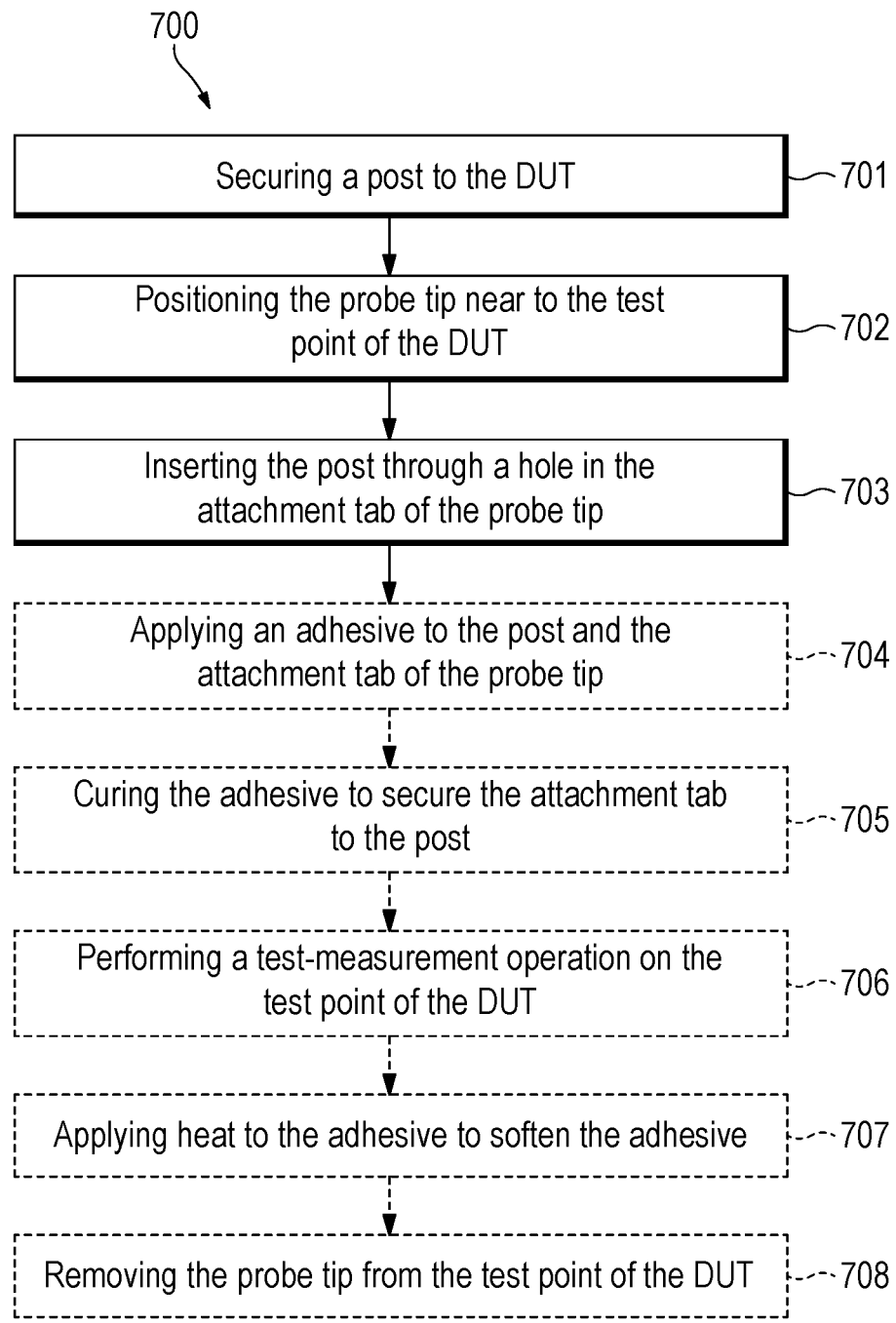
FIG. 7 illustrates a second example method of securing a probe tip to a device under test.

FIG. 7 illustrates a second example method of securing a probe tip 100 to a device under test. As illustrated in FIG. 7, a method 700 of securing a probe tip 100 to a device under test (DUT ion) may include: securing 701 a post 119 to the DUT 101 at a location on the DUT 101 other than at a target test point 106 of the DUT 101; positioning 702 the probe tip 100 near the test point 106 of the DUT 101, the probe tip 100 comprising a connection point 107 on a signal-path portion 104 of the probe tip 100 and an attachment tab 105, the connection point 107 making an electrical connection with the test point 106 of the DUT 101, the attachment tab 105 extending away from the signal-path portion 104 of the probe tip 100 and contacting the post 119; inserting 703 the post 119 through a hole 113 in the attachment tab 105 of the probe tip 100;

In configurations, the method 700 may further include applying 704 an adhesive 114 to the post 119 and the attachment tab 105 of the probe tip 100. In such configurations, the method 700 may further include curing 705 the adhesive 114 to secure the attachment tab 105 to the post 119.

In configurations, applying 704 the adhesive 114 to the post 119 and the attachment tab 105 may include applying a non-conductive, UV-curable adhesive to the post 119 and the attachment tab 105 of the probe tip 100.

In configurations, positioning 702 the probe tip 100 near the test point 106 further includes coupling a pin 115 at the connection point 107 of the probe tip 100 to the test point 106.

In configurations, inserting 703 the post 119 through the hole 113 in the attachment tab 105 includes snapping the post 119 into the hole 113 in the attachment tab 105 through an interference fit between the post 119 and the hole 113 in the attachment tab 105. In configurations, inserting 703 the post 119 through the hole 113 includes engaging a key-lock feature to mechanically secure the attachment tab 105 to the post 119.

In configurations, coupling 701 the post 119 to the DUT 101 includes removably coupling the post 119 to the DUT 101.

In configurations, the method 700 may further include: performing 706 a test—measurement operation on the test point 106 of the DUT 101; applying 707 heat to the adhesive 114 to soften the adhesive 114; and removing 708 the probe tip 100 from the test point 106 of the DUT 101.

Figure 8:
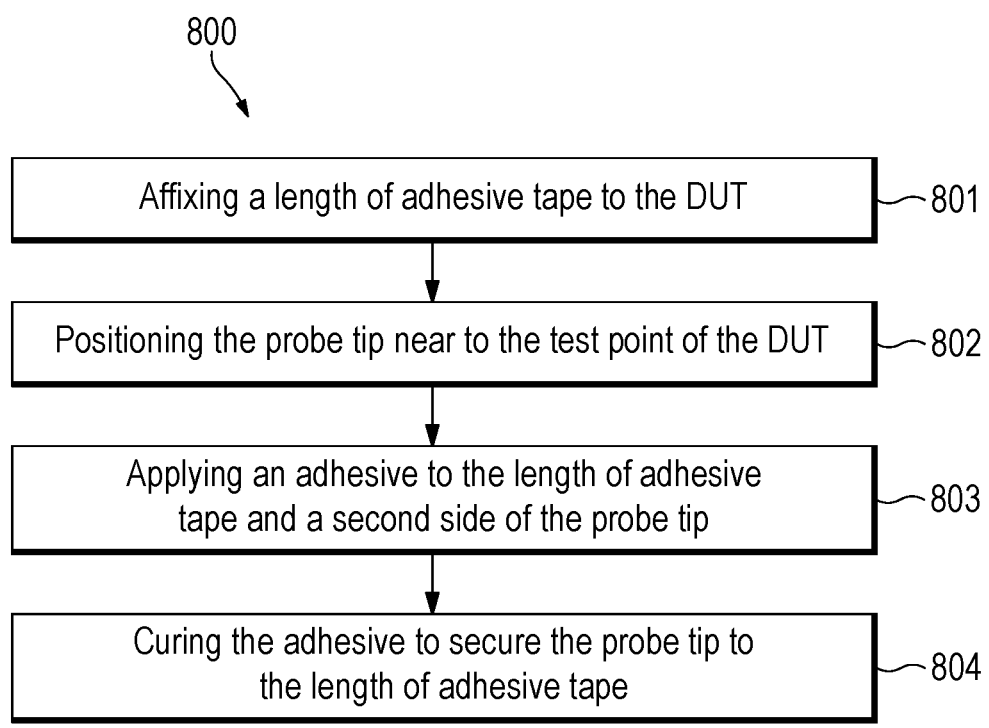
FIG. 8 illustrates a third example method of securing a probe tip to a device under test.

FIG. 8 illustrates a third example method of securing a probe tip 100 to a device under test. As illustrated in FIG. 8, a method 800 of securing a probe tip 100 to a device under test (DUT 101) may include: affixing 801 a length of adhesive tape 124 to the DUT 101 at a location on the DUT 101 other than at a target test point 106 of the DUT 101; positioning 802 the probe tip 100 near the test point 106 of the DUT 101, the probe tip 100 comprising a connection point 107 making an electrical connection with the test point 106 of the DUT 101; applying 803 an adhesive 114 between the length of adhesive tape 124 and the probe tip 100; and curing 804 the adhesive 114 to secure the probe tip 100 to the length of adhesive tape 124.

In configurations, the probe tip 100 may further include a clip coupled to a main portion 104 of the probe tip 100. In such configurations, applying 803 the adhesive 114 may include applying the adhesive 114 between the length of adhesive tape 124 and the clip of the probe tip 100. In configurations, applying 803 the adhesive 114 may include applying a non-conductive, UV-curable adhesive between the length of adhesive tape 124 and the clip of the probe tip 100.

In configurations, positioning 802 the probe tip 100 further includes coupling a pin 115 between the connection point 107 of the probe tip 100 and the test point 106.

Accordingly, aspects of the disclosed technology provide improved methods for securing a probe tip to a DUT.

EXAMPLES

Illustrative examples of the disclosed technologies are provided below. A particular configuration of the technologies may include one or more, and any combination of, the examples described below.

Example 1 includes a method of securing a probe tip to a device under test (DUT), the method comprising: positioning the probe tip near a test point of the DUT, the probe tip comprising a connection point on a signal-path portion of the probe tip and an attachment tab, the connection point making an electrical connection with the test point of the DUT, the attachment tab extending away from the signal-path portion of the probe tip; applying an adhesive to the DUT through a hole in the attachment tab of the probe tip; and curing the adhesive to secure the probe tip to the DUT.

Example 2 includes the method of Example 1, in which applying the adhesive to the attachment tab of the probe tip comprises applying a non-conductive, UV-curable adhesive to the attachment tab of the probe tip.

Example 3 includes the method of any of Examples 1-2, in which positioning the probe tip near the test point of the DUT further comprises coupling a pin between the connection point of the probe tip and the test point.

Example 4 includes the method of any of Examples 1-3, further comprising securing a post to the DUT, in which positioning the probe tip near the test point of the DUT further comprises inserting the post through the hole in the attachment tab of the probe tip.

Example 5 includes the method of Example 4, in which inserting the post through the hole in the attachment tab of the probe tip comprises snapping the post into the hole in the attachment tab through an interference fit between the post and the hole in the attachment tab.

Example 6 includes the method of any of Examples 4-5, in which inserting the post through the hole in the attachment tab of the probe tip comprises engaging a key-lock feature to mechanically secure the attachment tab to the post.

Example 7 includes the method of any of Examples 4-6, in which securing the post to the DUT comprises removably securing the post to the DUT.

Example 8 includes the method of any of Examples 4-7, in which the post is substantially translucent, and in which securing the post to the DUT comprises applying a non-conductive, UV-curable adhesive to the post and curing the adhesive to secure the post to the DUT by applying UV light through the post.

Example 9 includes the method of any of Examples 1-8, further comprising: performing a test—measurement operation on the test point of the DUT; applying heat to the adhesive to soften the adhesive; and removing the probe tip from the test point of the DUT.

Example 10 includes a method of securing a probe tip to a device under test (DUT), the method comprising: securing a post to the DUT; positioning the probe tip adjacent to a test point of the DUT, the probe tip comprising a connection point on a signal-path portion of the probe tip and an attachment tab, the connection point making an electrical connection with the test point of the DUT, the attachment tab extending away from the signal-path portion of the probe tip and contacting the post; and inserting the post through a hole in the attachment tab of the probe tip.

Example 11 includes the method of Example 10, further comprising applying an adhesive to the post and the attachment tab of the probe tip.

Example 12 includes the method of Example 11, in which applying the adhesive to the post and the attachment tab of the probe tip comprises applying a non-conductive, UV-curable adhesive to the post and the attachment tab of the probe tip.

Example 13 includes the method of Example 12, further comprising curing the adhesive to secure the attachment tab to the post.

Example 14 includes the method of any of Examples 10-13, in which positioning the probe tip near the test point of the DUT further comprises coupling a pin between the connection point of the probe tip and the test point.

Example 15 includes the method of any of Examples 10-14, in which inserting the post through the hole in the attachment tab of the probe tip comprises snapping the post into the hole in the attachment tab through an interference fit between the post and the hole in the attachment tab.

Example 16 includes the method of any of Examples 10-15, in which inserting the post through the hole in the attachment tab of the probe tip comprises engaging a key-lock feature to mechanically secure the attachment tab to the post.

Example 17 includes the method of any of Examples 10-16, in which securing the post to the DUT comprises removably securing the post to the DUT.

Example 18 includes the method of any of Examples 10-17 further comprising: performing a test—measurement operation on the test point of the DUT; applying heat to the adhesive to soften the adhesive; and removing the probe tip from the test point of the DUT.

Example 19 includes a method of securing a probe tip to a device under test (DUT), the method comprising: affixing a length of adhesive tape to the DUT; positioning the probe tip near a test point of the DUT, the probe tip comprising a connection point making an electrical connection with the test point of the DUT; applying an adhesive between the length of adhesive tape and the probe tip; and curing the adhesive to secure the probe tip to the length of adhesive tape.

Example 20 includes the method of Example 19, the probe tip further comprising a clip coupled to the probe tip, in which applying the adhesive between the length of adhesive tape and the probe tip comprises applying the adhesive between the length of adhesive tape and the clip of the probe tip.

Example 21 includes the method of Example 20, in which the clip is substantially translucent, and in which applying the adhesive between the length of adhesive tape and the clip includes applying a non-conductive, UV-curable adhesive between the length of adhesive tape and the clip, and curing the non-conductive, UV-curable adhesive by applying UV light through the clip.

Example 22 includes the method of any of Examples 19-21, in which positioning the probe tip near the test point of the DUT further comprises coupling a pin between the connection point of the probe tip and the test point.

Example 23 includes the method of any of Examples 19-22 further comprising: performing a test—measurement operation on the test point of the DUT; peeling the length of adhesive tape off of the DUT; applying heat to the adhesive to soften the adhesive; and removing the probe tip from the length of adhesive tape.

Example 24 includes a probe tip for a test-and-measurement probe, the probe tip comprising: a signal-path portion of the probe tip, the signal-path portion of the probe tip having at least one electrical signal path; a connection point on the signal-path portion of the probe tip, the connection point configured to electrically connect a test point on a device under test (DUT) to the at least one signal path; and an attachment tab extending away from the signal-path portion of the probe tip, the attachment tab structured to provide a surface for adhering to an adhesive.

Example 25 includes the probe tip of Example 24, wherein the attachment tab includes a hole structured to receive a post secured to the DUT.

Aspects may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various configurations. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific example configurations have been described for purposes of illustration, it will be understood that various modifications may be made without departing from the spirit and scope of the disclosure.

I claim:

1. A method of securing a probe tip to a device under test (DUT), the method comprising:
   positioning the probe tip near a test point of the DUT, the probe tip comprising a connection point on a signal-path portion of the probe tip and an attachment tab, the connection point making an electrical connection with the test point of the DUT, the attachment tab extending away from the signal-path portion of the probe tip;
   applying an adhesive through a hole in the attachment tab of the probe tip; and
   curing the adhesive to secure the probe tip to the DUT.

2. The method of claim 1, in which applying the adhesive through the hole in the attachment tab of the probe tip comprises applying a non-conductive, UV-curable adhesive through the hole in the attachment tab of the probe tip.

3. The method of claim 1, in which positioning the probe tip near the test point of the DUT further comprises coupling a pin between the connection point of the probe tip and the test point.

4. The method of claim 1, further comprising securing a post to the DUT, in which positioning the probe tip near the test point of the DUT further comprises inserting the post through the hole in the attachment tab of the probe tip.

5. The method of claim 4, in which inserting the post through the hole in the attachment tab of the probe tip comprises snapping the post into the hole in the attachment tab through an interference fit between the post and the hole in the attachment tab.

6. The method of claim 4, in which inserting the post through the hole in the attachment tab of the probe tip comprises engaging a key-lock feature to mechanically secure the attachment tab to the post.

7. The method of claim 4, in which securing the post to the DUT comprises removably securing the post to the DUT.

8. The method of claim 4, in which the post is substantially translucent, and in which securing the post to the DUT comprises applying a non-conductive, UV-curable adhesive to the post and curing the adhesive to secure the post to the DUT by applying UV light through the post.

9. The method of claim 1, further comprising:
   performing a test-measurement operation on the test point of the DUT;
   applying heat to the adhesive to soften the adhesive; and
   removing the probe tip from the test point of the DUT.

10. A method of securing a probe tip to a device under test (DUT), the method comprising:
    securing a post to the DUT;
    positioning the probe tip adjacent to a test point of the DUT, the probe tip comprising a connection point on a signal-path portion of the probe tip and an attachment tab, the connection point making an electrical connection with the test point of the DUT, the attachment tab extending away from the signal-path portion of the probe tip and contacting the post; and
    inserting the post through a hole in the attachment tab of the probe tip.

11. The method of claim 10, further comprising applying an adhesive to the post and the attachment tab of the probe tip.

12. The method of claim 11, in which applying the adhesive to the post and the attachment tab of the probe tip comprises applying a non-conductive, UV-curable adhesive to the post and the attachment tab of the probe tip.

13. The method of claim 12, further comprising curing the adhesive to secure the attachment tab to the post.

14. The method of claim 10, in which positioning the probe tip near the test point of the DUT further comprises coupling a pin between the connection point of the probe tip and the test point.

15. The method of claim 10, in which inserting the post through the hole in the attachment tab of the probe tip comprises snapping the post into the hole in the attachment tab through an interference fit between the post and the hole in the attachment tab.

16. The method of claim 10, in which inserting the post through the hole in the attachment tab of the probe tip comprises engaging a key-lock feature to mechanically secure the attachment tab to the post.

17. The method of claim 10, in which securing the post to the DUT comprises removably securing the post to the DUT.

18. The method of claim 10 further comprising:
    performing a test-measurement operation on the test point of the DUT;
    applying heat to the adhesive to soften the adhesive; and
    removing the probe tip from the test point of the DUT.

19. A method of securing a probe tip to a device under test (DUT), the method comprising:
    affixing a length of adhesive tape to the DUT;

positioning the probe tip near a test point of the DUT, the probe tip comprising a connection point making an electrical connection with the test point of the DUT;

applying an adhesive between the length of adhesive tape and the probe tip; and curing the adhesive to secure the probe tip to the length of adhesive tape.

20. The method of claim 19, the probe tip further comprising a clip coupled to the probe tip, in which applying the adhesive between the length of adhesive tape and the probe tip comprises applying the adhesive between the length of adhesive tape and the clip of the probe tip.

21. The method of claim 20, in which the clip is substantially translucent, and in which applying the adhesive between the length of adhesive tape and the clip includes applying a non-conductive, UV-curable adhesive between the length of adhesive tape and the clip, and curing the non-conductive, UV-curable adhesive by applying UV light through the clip.

22. The method of claim 19, in which positioning the probe tip near the test point of the DUT further comprises coupling a pin between the connection point of the probe tip and the test point.

23. The method of claim 19 further comprising:

performing a test-measurement operation on the test point of the DUT;

peeling the length of adhesive tape off of the DUT;

applying heat to the adhesive to soften the adhesive; and removing the probe tip from the length of adhesive tape.

24. A probe tip for a test-and-measurement probe, the probe tip comprising:

a signal-path portion of the probe tip, the signal-path portion of the probe tip having at least one electrical signal path;

a connection point on the signal-path portion of the probe tip, the connection point configured to electrically connect a test point on a device under test (DUT) to the at least one signal path; and an attachment tab extending away from the signal-path portion of the probe tip, the attachment tab structured to provide a surface for adhering to an adhesive.

25. The probe tip of claim 24, wherein the attachment tab includes a hole structured to receive a post secured to the DUT.

\* \* \* \* \*